(12) United States Patent
Chakrabarti

(10) Patent No.: US 6,744,796 B1
(45) Date of Patent: Jun. 1, 2004

(54) PASSIVATED OPTICAL DEVICE AND METHOD OF FORMING THE SAME

(75) Inventor: Utpal Kumar Chakrabarti, Allentown, PA (US)

(73) Assignee: TriQuint Technology Holding Co., Hillsboro, OR (US)

( * ) Notice: Subject to any disclaimer, the term of this patent is extended or adjusted under 35 U.S.C. 154(b) by 0 days.

(21) Appl. No.: 09/538,446

(22) Filed: Mar. 30, 2000

(51) Int. Cl.$^7$ .................................................. H01S 5/00
(52) U.S. Cl. ........................................... 372/43; 372/49
(58) Field of Search ............................ 372/49, 43, 45; 347/56, 65; 350/164; 438/33, 38, 26; 257/98

(56) References Cited

U.S. PATENT DOCUMENTS

| | | | | |
|---|---|---|---|---|
| 4,337,443 A | * | 6/1982 | Umeda et al. ................. 372/49 |
| 4,563,368 A | * | 1/1986 | Tihanyi et al. ................. 438/38 |
| 4,656,638 A | * | 4/1987 | Tihanyi et al. ................. 372/49 |
| 4,749,255 A | * | 6/1988 | Chakrabarti et al. ......... 350/164 |
| 4,985,370 A | * | 1/1991 | Ponjee et al. ................. 438/38 |
| 5,063,173 A | | 11/1991 | Gasser et al. |
| 5,144,634 A | | 9/1992 | Gasser et al. |
| 5,208,468 A | * | 5/1993 | Kawanishi et al. ............ 257/98 |
| 5,228,047 A | * | 7/1993 | Matsumoto et al. ........... 372/45 |
| 5,260,231 A | * | 11/1993 | Kawanishi et al. ............ 438/38 |
| 5,665,637 A | | 9/1997 | Chand |
| 5,668,049 A | * | 9/1997 | Chakrabarti et al. .......... 438/33 |
| 5,780,120 A | | 7/1998 | Belouet et al. |
| 5,799,028 A | * | 8/1998 | Geels et al. ................... 372/49 |
| 5,849,371 A | | 12/1998 | Beesley |
| 5,863,397 A | | 1/1999 | Tu et al. |
| 5,933,705 A | * | 8/1999 | Geels et al. ................... 438/26 |
| 6,305,790 B1 | * | 10/2001 | Kawamura et al. ........... 347/56 |
| 6,336,714 B1 | * | 1/2002 | Kawamura et al. ........... 347/65 |

* cited by examiner

*Primary Examiner*—Paul Ip
*Assistant Examiner*—Tuan Nguyen
(74) *Attorney, Agent, or Firm*—Wendy W. Koba

(57) ABSTRACT

A semiconductor optical device structure includes passivated facets formed by first removing the native oxide contaminant with a "non-reactive" molecular gas etchant, such as $XeF_2$. As the oxide is removed, a passivation flux is introduced into the vacuum chamber so as to begin the process of forming a passivation layer to cover the exposed facet surface. The gas etchant is slowly turned off and the flux is increased so as to form a passivation layer of the desired thickness on the "cleaned" facet surface. A protective film is then be evaporated to cover the passivation layer.

9 Claims, 3 Drawing Sheets

PASSIVATED OPTICAL DEVICE AND METHOD OF FORMING THE SAME

FIELD OF THE INVENTION

The present invention relates to a passivated optical device and a method of passivating optical device facets; more particularly, to providing a two-step in situ process including etching the facet surface and directing a passivating flux toward the facet to provide the necessary protection.

BACKGROUND OF THE INVENTION

Semiconductor lasers that comprise a laser cavity defined by two parallel laser facets are well-known in the art. Among these are Fabry-Perot lasers and distributed feedback (DFB) lasers.

Despite much effort aimed at improving the reliability of lasers with facets, such lasers frequently are subject to early performance degradation and/or laser failure. This problem is particularly severe in high power lasers, e.g., in lasers that would otherwise be well-suited as pump lasers for optical fiber amplifiers in optical communication systems. The origin of this early performance degradation/failure can be attributed to a process involving a cascade of events and in particular carrier recombination in fault-containing zones of the facets, a reduction in the width of the forbidden band in these zones due to the heating caused by the carrier recombination, and, finally, increasing optical absorption of the radiation emitted by the laser due to the reduction in bandwidth. These phenomena contribute to accelerated heating of the facets of the laser and lead finally to irreversible destruction of the laser facets, often referred to as "catastrophic optical damage", or "COD". Furthermore, the dielectric facet coating itself or the impurities in the coating can react with the semiconductor laser facets in the presence of light, heat and bias energies, resulting in facet degradation.

It is known that laser performance degradation can be reduced by provision of a contamination-free facet, followed by in-situ application of a passivation layer. U.S. Pat. Nos. 5,063,173 and 5,144,634 disclose that the passivation layer consists of Si, Ge or Sb, and that the passivation layer is deposited in situ onto a contamination-free laser facet. U.S. Pat. No. 5,171,717 discloses apparatus for cleaving semiconductor wafers in a vacuum system to minimize facet contamination. An alternative passivation technique, disclosed in U.S. Pat. No. 5,260,231, requires the inclusion of a sulfur-containing layer interposed between the facet surface and a passivation layer.

These and other prior art techniques of facet passivation are considered to put relatively severe requirements on the manufacturing process in terms of needing an ultra-high vacuum (UHV), high temperature, special fixturing, or any combination of the above. A need remains, therefore, for a passivation technique that is relatively simple and inexpensive, yet provides a laser facet of improved quality.

SUMMARY OF THE INVENTION

The need remaining in the prior art is addressed by the present invention, which relates to a passivated optical device structure and a method of passivating optical device facets using a two-step in situ process including etching the facet surface and directing a passivating flux toward the facet to provide the necessary protection.

In accordance with the present invention, the native oxide resident on the facet surface subsequent to cleaving is removed by using a non-damaging etch. The etch is accomplished in a minimal vacuum environment (e.g., 1E-6 torr), using a molecular gas such as, for example, $XeF_2$. Once the etch is nearing its completion, a flux of passivating material (such as Si or ZnSe) is directed toward the etched facet surface. In accordance with the present invention, the etch processing is then slowly ramped down and the flux ramped up until the etch is completely turned off. The flux will result in the creation of a passivation film of a desired thickness (for example, approximately 200 Å). While maintaining the device in the vacuum chamber, an in situ deposition of a protective covering film, such as any suitable oxide (e.g., SiO, $SiO_2$, $Al_2O_3$, $Ta_2O_3$, or any combination thereof), is formed to completely cover the passivation layer.

In a preferred embodiment of the present invention, the covering film is formed using a benign process, such as thermal evaporation. Various other films besides oxides may be used as the outer covering layer, as long as the material provides the desired optical reflectivity requirements. The opposite laser facet may be similarly passivated by following the procedures of the present invention as outlined above.

Other and further features and capabilities of the present invention will become apparent during the course of the following discussion and by reference to the accompanying drawings.

BRIEF DESCRIPTION OF THE DRAWINGS

Referring now to the drawings.

DETAILED DESCRIPTION

Figure 1:
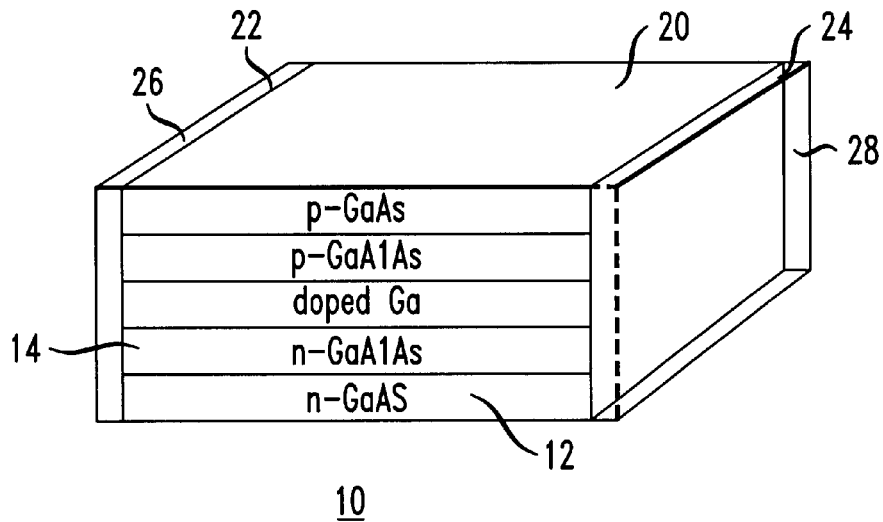
FIG. 1 illustrates an exemplary prior art optical device structure with cleaved facets exhibiting a native oxide covering.

Referring back to FIG. 1, laser 10 is cleaved using processes well-known in the art to form facets 22 and 24, used as reflective mirror surfaces for lasing action. As mentioned above, the exposure of facets 22,24 to a typical environment results in the formation of an oxide on the facet surfaces. Oxide layers 26 and 28 are illustrated in FIG. 1 as covering facets 22 and 24, respectively. A prior art technique for minimizing oxide formation is to perform the facet cleaving operation in an ultra-high vacuum (UHV), followed immediately by an in situ deposition of a passivation material. While successful in essentially eliminating the oxide growth, the requirement of performing the cleaving under vacuum is problematic, time-consuming and expensive. In contrast, the technique of the present invention allows for a conventional, room temperature cleaving operation to be used, since later steps are performed to remove the native oxide that thereafter forms.

It is to be understood that other III–V regimes may be involved and the arrangement of FIG. 1 is exemplary only. In particular, crystalline materials of two or more of the following may also be used: In, Ga, Al, P, Sb, Sn and Te, forming any desired type of optical device, such as a laser or light emitted diode. Indeed, the passivation of the present invention may be used in association with facets of any optoelectronic structure. The illustration of a "laser" throughout the rest of the following discussion is thus considered to be exemplary only.

Referring back to FIG. 1, laser 10 is cleaved using processes well-known in the art to form facets 22 and 24, used as reflective mirror surfaces for lasing action. As mentioned above, the exposure of facets 22,24 to a typical environment results in the formation of an oxide on the facet surfaces. Oxide layers 26 and 28 are illustrated in FIG. 1 as covering facets 22 and 24, respectively. A prior art technique for minimizing oxide formation is to perform the facet cleaving operation in an ultra-high vacuum (UHV), followed immediately by an in situ deposition of a passivation material. While successful in essentially eliminating the oxide growth, the requirement of performing the cleaving under vacuum is problematic, time-consuming and expensive. In contrast, the technique of the present invention allows for a conventional, room cleaving operation to be used, since later steps are performed to remove the native oxide that thereafter forms.

Figure 2:
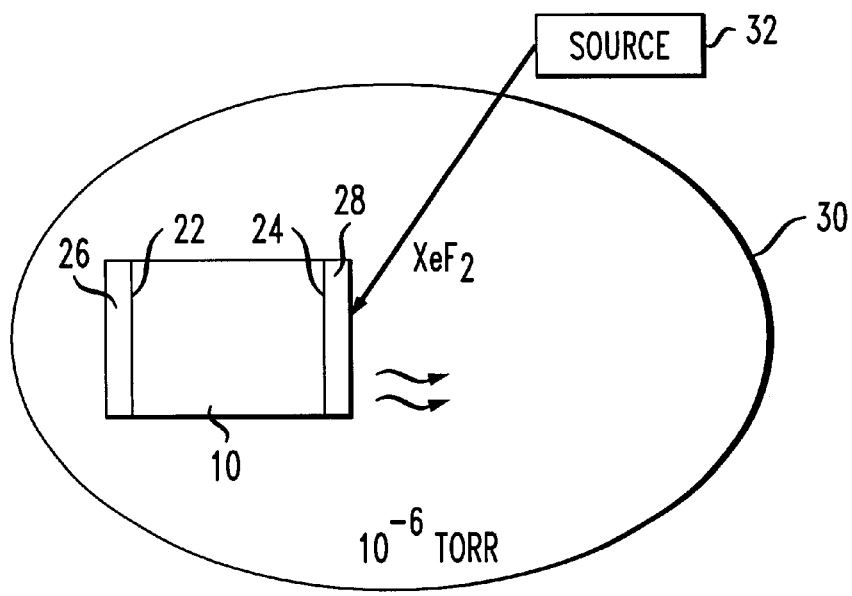
FIGS. 2–5 illustrate the various steps of the present invention related to the removal of the oxidation from the facet surfaces and formation of a passivation structure over the cleaned facet.

In particular, the first step of the passivation process of the present invention is illustrated in FIG. 2. As shown laser 10—exhibiting oxide films 26, 28—is placed in a vacuum chamber 30. Unlike prior art UHV requirements, the vacuum required for the steps of the present invention is minimal, on the order of $10^{-6}$ torr. The first step of the present invention is to remove an oxide surface, such as film 28 covering facet 24. The film is removed by using a molecular gas etchant, such as $XeF_2$. The use of a non-energetic beam results in remove the oxide without damaging the underlying facet surface. Referring to FIG. 2, a gas source 32 is illustrated as located exterior to vacuum chamber 30 and is used to provide the molecular gas etchant. It is to be noted that FIG. 2 is merely illustrative of the particular components required to perform the etching process; the precise location of gas source 32 is not to be presumed from this illustration and, in fact, the etchant beam from gas source 32 can be in any desired orientation with respect to laser 10.

Figure 3:
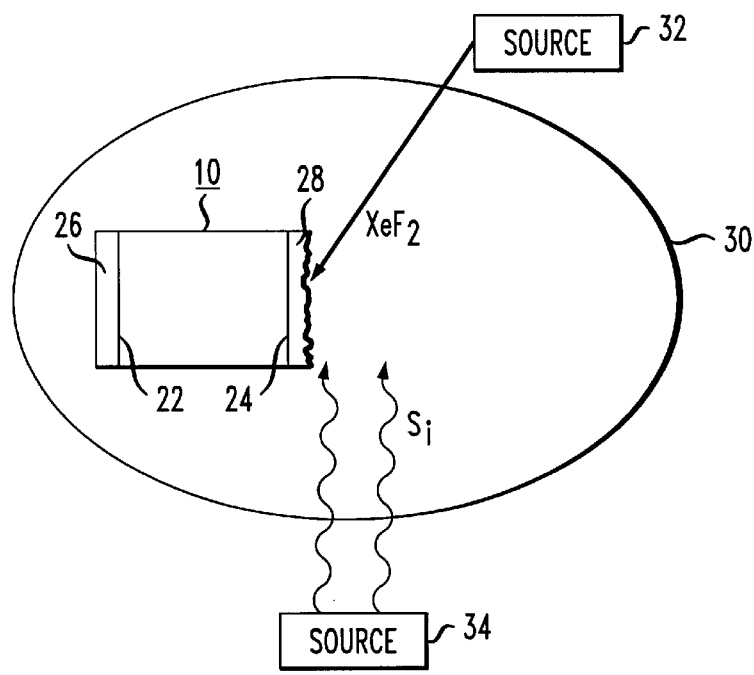
Figure 4:
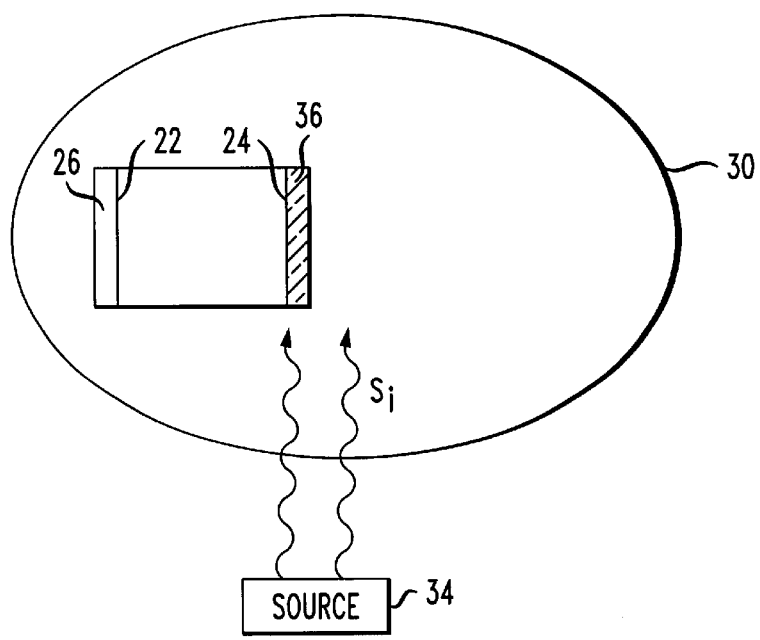
Figure 5:
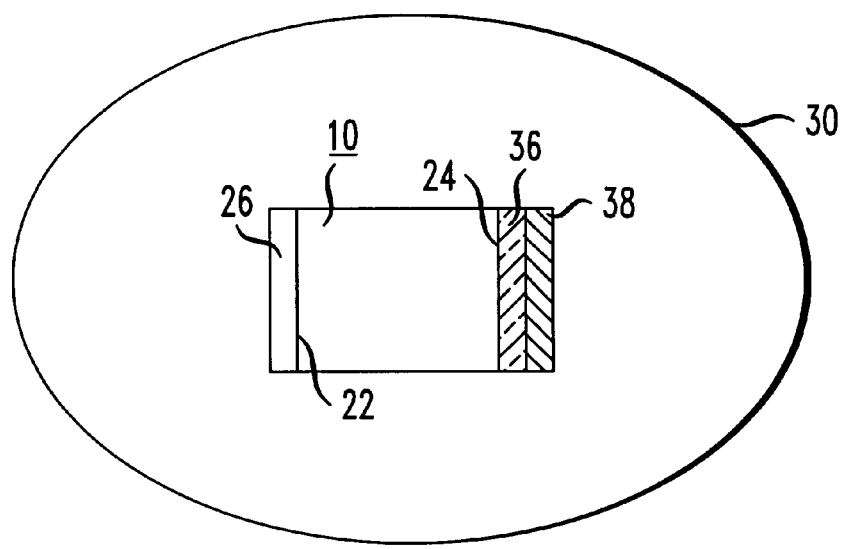

As the etching process is nearing its completion (as determined by a predetermined time required to remove the measured thickness of the oxide film), a flux of passivating material is directed toward the etched surface (the etching thus exposing the "clean" surface of facet 24). FIG. 3 illustrates this step in the process, and includes a source 34 of passivation material, as well as molecular gas source 32. Slowly, the $XeF_2$ beam is turned "off" and a full flux of passivation material is used to cover laser facet 24, as shown in FIG. 4. In one exemplary embodiment, a passivation layer 36 having a thickness of approximately 200 Å is formed. There exist a variety of passivation materials that can be used in the method of the present invention, including but not limited to, Si, ZnSe and others.

Following the formation of passivation layer 36, an in situ protective film 38 is formed to cover passivation layer 36. Protective film 38, which may comprise any of the oxides mentioned above, provides the desired optical reflectivity while also preventing damage or corruption to passivation layer 36. In accordance with the present invention, protective film 38 is formed using a "benign" technique that will not perturb the underlying structure. For example, thermal evaporation may be used. The protective film may comprise any desired thickness, where values in the range of 1500–2500 Å have been found acceptable.

Once facet 24 has been etched and passivated, laser 10 can be re-positioned so that the same steps can be used to clean and passivate 22. That is, a molecular gas etch is first used to remove oxide film 26 from facet 22 and, as that oxide is depleted, the passivation flux is initiated. When the etch gas is completely turned "off", a full flux is used to form a second passivation layer 40 (having a thickness of, for example, 100 Å) to cover facet 22. A second protective film 42 is then evaporated to cover passivation layer 40.

Figure 6:
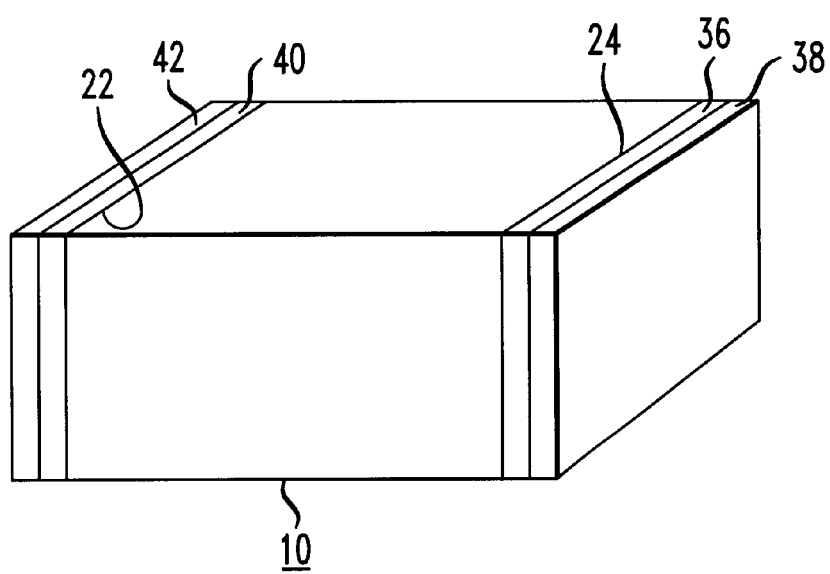
FIG. 6 illustrates an exemplary optical device structure including both a passivation layer and covering layer formed to cover each facet surface.

FIG. 6 illustrates a completed device passivated in accordance with the present invention. As shown, first facet 24 is covered by passivation layer 36 and protective film 38. Similarly, second facet 22 is covered by, in sequence, passivation layer 40 and protective film 42. It is to be understood that various other materials can be used as the flux to form the passivation layers and evaporated to cover the passivation layers and form the protective films. In general, the spirit and scope of the present invention is considered to be limited only by the claims appended hereto.

What is claimed is:

1. A method of passivating a semiconductor optical device structure, the method comprising the steps of:

a) cleaving an optical device structure to form a pair of opposing facets;

b) placing the cleaved optical device structure in a vacuum chamber exhibiting a minimal vacuum;

c) etching a first facet of the pair of opposing facets to remove native oxide contamination, using a molecular gas etchant to perform the etching;

d) as the etching is completing, determined by a predetermined time required to remove the native oxide contamination, initiating a flux of passivation material toward the facet surface being etched so that the etching continues as the flux is beginning to deposit;

e) slowly turning off the etching process and continuing with the flux of passivation material until a predetermined thickness of a passivation layer is formed on the etched facet surface; and f) thermally evaporating a protective film of a predetermined thickness over the passivation layer.

2. The method as defined in claim 1 wherein steps c) through f) are repeated for the second, opposing facet.

3. The method as defined in claim 1 wherein in performing step b), the vacuum chamber exhibits a vacuum of approximately $10^{-6}$ torr.

4. The method as defined in claim 1 wherein in performing step c), the molecular gas $XeF_2$ is used as the etchant.

5. The method as defined in claim 1 wherein in performing d), a flux of silicon is used as the passivation material.

6. The method as used in claim 1 wherein in performing step d), a flux of ZnSe is used as the passivation material.

7. The method as defined in claim 1 wherein in performing step e), a passivation film having a thickness of approximately 200 Å is formed.

8. The method as defined in claim 1 wherein in performing step f), a protective oxide film is evaporated.

9. The method as defined in claim 1 wherein in performing step f), a protective film having a thickness in the range of 1500–2500 Å is evaporated.

* * * * *